United States Patent [19]

Fletcher et al.

[11] 4,025,876
[45] May 24, 1977

[54] DISTRIBUTED FEEDBACK ACOUSTIC SURFACE WAVE OSCILLATOR

[76] Inventors: James C. Fletcher, Administrator of the National Aeronautics and Space Administration, with respect to an invention of Charles Elachi, Pasadena, Calif.

[22] Filed: Sept. 12, 1975

[21] Appl. No.: 613,004

[52] U.S. Cl. .......................... 331/107 A; 330/5.5; 333/72
[51] Int. Cl.² ...................... H03B 5/32; H03B 9/12
[58] Field of Search .................... 333/30 R, 72; 331/107 A; 330/5.5

[56] References Cited

UNITED STATES PATENTS

| | | | |
|---|---|---|---|
| 3,388,334 | 6/1968 | Adler | 330/5.5 |
| 3,414,779 | 12/1968 | Bohm | 331/107 A |
| 3,568,079 | 3/1971 | Yoder | 330/5.5 |
| 3,678,304 | 7/1972 | Humphryes et al. | 330/5.5 |
| 3,679,985 | 7/1972 | Fang et al. | 330/5.5 |
| 3,686,579 | 8/1972 | Everett | 330/5.5 |
| 3,826,932 | 7/1974 | Wang | 330/5.5 |
| 3,909,741 | 9/1975 | Harris | 330/5.5 |

OTHER PUBLICATIONS

Fang et al., IBM Tech. Disc. Bul., vol. 13, No. 11, Apr. 1971.
Fang et al., IBM Tech. Disc. Bul., vol. 12, No. 10, Mar. 1970.
Proc. IEEE, vol. 58, No. 8, Aug. 1970, 1238–1276.

*Primary Examiner*—John Kominski
*Attorney, Agent, or Firm*—Monte F. Mott; Paul F. McCaul; John R. Manning

[57] ABSTRACT

An acoustic surface wave oscillator is constructed from a semiconductor-piezoelectric acoustic surface wave amplifier by providing appropriate perturbations at the piezoelectric boundary. The perturbations cause Bragg order reflections that maintain acoustic-wave oscillation under certain conditions of gain and feedback.

5 Claims, 10 Drawing Figures

DISTRIBUTED FEEDBACK ACOUSTIC SURFACE WAVE OSCILLATOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

This invention relates generally to acoustic wave generating apparatus and more particularly pertains to acoustic surface wave oscillators.

Since the advent of the distributed feedback laser which is characterized by the creation of periodic disturbances in the lasing medium to cause additive reflection of the generated laser energy, considerable work has been expended in providing a device to create those periodic disturbances. The most common technique utilized to date is to groove or sculpt the lasing medium to create physical perturbations. Another well known technique which is described and claimed in a copending patent application titled "An Acoustically Controlled Distribute Feedback Laser", by the present inventor, having Ser. No. 374,423, filed June 28, 1973 is the technique of using acoustic standing waves to define the perturbations in the laser medium.

In the latter instance, wherein an acoustic standing wave is utilized to provide the periodic perturbations in the laser medium, it has been customary to utilize acoustic transducers for the production of acoustic waves. The utilization of an acoustic surface wave oscillator to provide the periodic perturbations in a laser medium finds important application in laser communication devices such as multiplexers, modulators, and amplifiers. Prior to the present invention, an acoustic surface-wave oscillator had not been contemplated.

OBJECTS AND SUMMARY OF THE INVENTION

An object of this invention is to provide an acoustic surface-wave oscillator.

Another object of this invention is to provide an acoustic surface-wave oscillator that is self sustaining.

Yet another object of this invention is to provide an acoustic surface-wave generator that may conveniently be used with distributed feedback laser devices.

Still another object of this invention is to provide a narrow-band acoustic surface-wave oscillator.

These objects and the general purpose of this invention are accomplished in the following manner. Perturbing the interface between a piezoelectric and semiconductor material to form a Bragg grating creates a backward travelling acoustic wave that functions as a positive feedback to establish acoustic wave oscillation at a frequency determined by the dimensions of the grating.

BRIEF DESCRIPTION OF THE DRAWINGS

Both the organization and manner of operation of the invention as well as the attendant advantages and further objects thereof may be best understood by reference to the following detailed description taken in conjunction with the accompanying drawings wherein like reference numerals designate like parts throughout the figures thereof and wherein.

DESCRIPTION OF THE PREFERRED EMBODIMENTS

Figure 1:
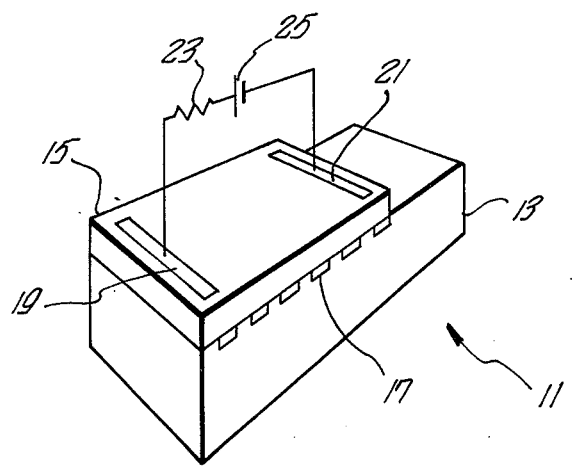
FIG. 1 is a perspective and partial schematic drawing of a preferred embodiment of the present invention.

The acoustic surface wave oscillator 11 of the present invention preferably consists of a piezoelectric substrate 13 carrying a layer of semiconductor material 15. The interface between the semiconductor material 15 and the piezoelectric material 13 is characterized by periodic perturbations 17 such as caused by a surface corrugation or grating. An electron drift is created in the semiconductor material or medium 15 by a DC voltage source 23, 25 connected between opposite ends of the semiconductor material 15 by way of electrodes 19 and 21.

Figure 2:
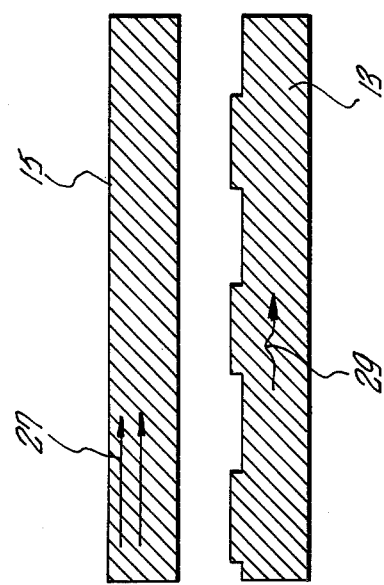
FIG. 2 is a schematic illustration of a preferred interface used in the oscillator of FIG. 1.

As shown in FIG. 2, the interface between the semiconductor medium 15 and the piezoelectric medium 13 creates a distributed feedback acoustic cavity for the positive feedback of acoustic waves therein. By causing an electron drift in a direction 27 in the semiconductor material 15, a moving electromagnetic field is created that causes a physical reaction in the piezoelectric material 13. This mechanical disturbance in the piezoelectric material 13 generates the acoustic surface wave 29 in the direction of the drifting electrons 27. The action of the perturbations 17, illustrated in the form of gratings, on the generated acoustic surface wave will be explained hereinafter.

Figure 3:
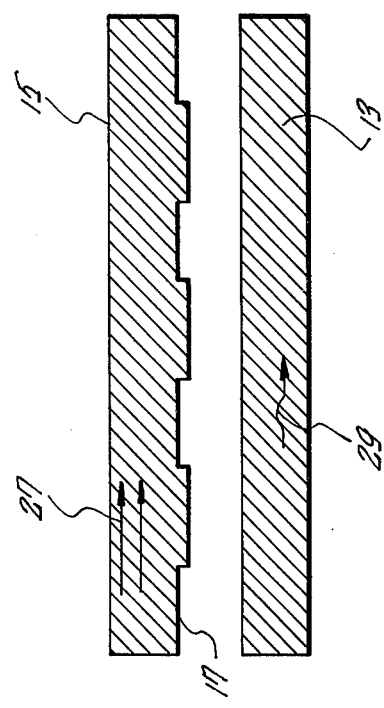
FIG. 3 is a schematic illustration of an alternate preferred interface utilized in the oscillator of FIG. 1.
Figure 5:
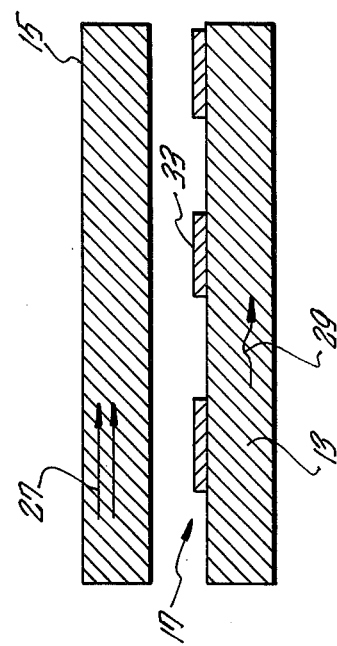
FIG. 5 is a schematic of yet another preferred interface utilized in the oscillator of FIG. 1.

FIGS. 3 and 5 illustrate alternate methods of creating the periodic perturbations at the interface between the semiconductor material 15 and the piezoelectric medium 13. In FIG. 3, the perturbations 17 are gratings created on the interface surface of the semiconductor medium 15. In FIG. 5, the perturbations 17 are created by depositing, such as by photodeposition techniques, any material in the form of strips 33 on either the piezoelectric medium 13, as shown, or on the semiconductor medium 15 (not shown).

Figure 4:
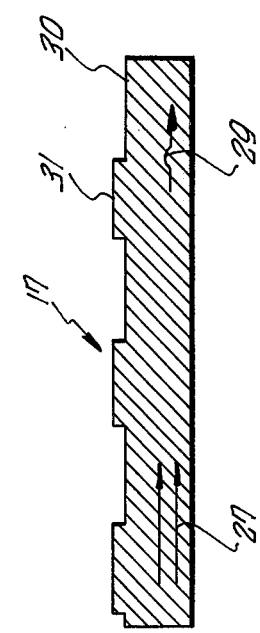
FIG. 4 is a schematic of an alternate embodiment of this invention.

If desired, materials in existence that exhibit both semiconductor and piezoelectric characteristics such as GaAs, ZnO, Cds, CdSe, InSb may be used as the medium 30 (FIG. 4) for supporting both electron drift 27 and the acoustic surface wave 29. The perturbations 17 are created on one of the medium's surfaces by way of gratings or deposited strips of material 31. The electron drift 27 is conveniently created in the medium 30 by a DC voltage source connected to the medium in the manner shown in FIG. 1.

The purpose of perturbations at the interface between the semiconductor and piezoelectric material, or on the surface of the piezoelectric-semiconducting material, is to provide distributed feedback of the propagated acoustic surface-wave. This creates a positive feedback that reinforces the propagating surface wave in a manner to provide virtually self-sustaining oscillation of the acoustic surface wave.

Figure 6:
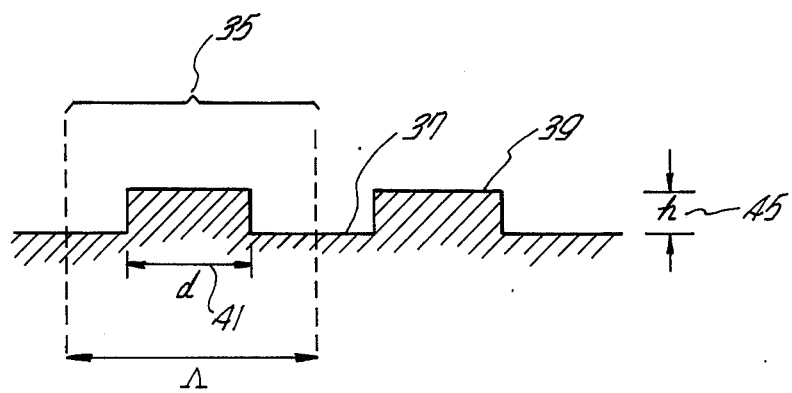
FIG. 6 is a schematic identifying the dimensional relations of the gratings used in the preferred embodiment of this invention.

Consider now the theoretical operation of such an acoustic surface-wave oscillator. The feedback efficiency for the acoustic wave is expressed by the coupling coefficient between a forward travelling and a backward travelling wave. Consider a surface wave having a wavelength ($\lambda$) propagating on the corrugated or grated surface of FIG. 6. Assume that the h height 45 of the gratings 39 is much smaller than the wavelength ($\lambda$) of the surface wave and assume the $\Lambda$ length 35 of a single grating cell to be equal to $\lambda/2$. This parameter relationship satisfies Bragg reflection conditions.

Figures 7, 8:
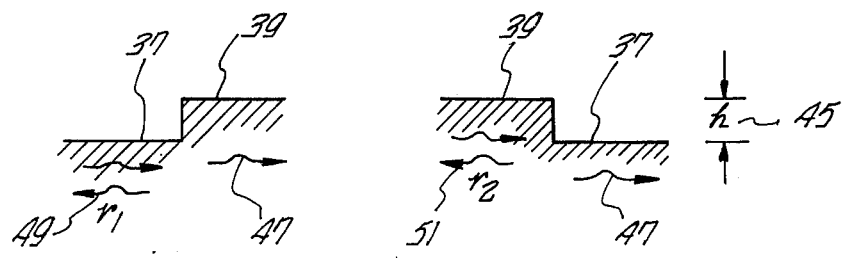
FIG. 7 is a schematic diagram illustrating acoustic-wave travel through the grating structure of the present invention.
FIG. 8 is a schematic diagram illustrating acoustic-wave travel through the grating structure of the present invention.

An acoustic travelling wave 47 on a grating surface will be reflected according to an $r_1$ reflection coefficient, 49 when the wave encounters a vertical surface elevation 39 (FIG. 7). The same travelling wave 47 will be reflected according to an $r_2$ reflecting coefficient, 51 when it encounters a vertical surface depression 37 (FIG. 8). Since in FIG. 6 we defined a grating cell to have both a vertical surface elevation 39 and a vertical surface depression 37, the reflection coefficient (R) of one grating cell can be expressed as:

$$R = r_1 e^{i\frac{2\pi d}{\lambda}} + r_2 e^{-i\frac{2\pi d}{\lambda}}$$

$$= i(r_1 - r_2)$$

Assume that the d length 41 of a surface elevation 39 is equal to $\Lambda/2$ and therefore is equal to $\lambda/4$ and that the absolute values of $r_1$ and $r_2$ are small so that multiple reflections can be ignored. The overall reflection coefficient R represents the energy transferred from the forward wave 47 to the backward wave over a length equal to $\Lambda$, the length of one grating cell. Consequently the coupling coefficient ($\chi$) can be represented by:

$$X = R/\Lambda$$

$$= \frac{i(r_1 - r_2)}{\Lambda}$$

$$= \frac{2i(r_1 - r_2)}{\lambda}$$

We are only interested in evaluating the order or magnitude of the coupling coefficient $\chi$. It is known that the reflection from vertical boundaries such as $r_1$ and $r_2$ are of the same order of magnitude as $h/\lambda$ and that the $r_2$ reflection 51 from a vertical surface depression is many times larger than the $r_1$ reflection 49 from a vertical surface elevation. Both reflections are negative for an h height 45 that is much smaller than the wavelength. Consequently, we can say that:

$$X = \frac{ih}{\lambda^2}$$

Placing this in a normalized form we have:

$$X^L = \frac{ihL}{\lambda^2}$$

where:
L is overall length of the grating
$\chi L$ is the total coupling coefficient The relationship between the coupling coefficient $\chi L$, the threshhold gain coefficient $g$, and the wave vector mismatch $\delta$ (where $\delta = \beta - \beta_o$, the difference between the operating wave vector and the Bragg wave vector $2\pi/\Lambda$) is known. This relationship has also been generalized in the case where the gain $g_1$ in the forward direction is different from the gain or loss $g_2$ in the backward direction. This relation is:

$$X^L = \frac{\pm \psi}{\sin h(L)}$$

where: $\psi = [(\bar{g} - j\delta)^2 - X^2]^{1/2}$ $$\bar{g} = \frac{(g_1 + g_2)}{2}$$

This relationship has many solutions which correspond to the longitudinal spectrum of distributed oscillators.

Figure 9:
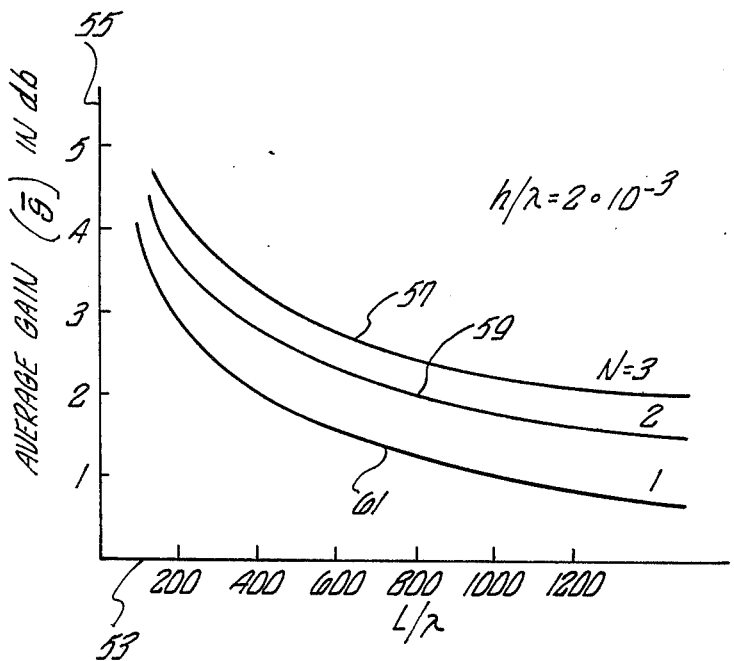
FIG. 9 is a graph illustrating the gain versus grating necessary to provide oscillation.
Figure 10:
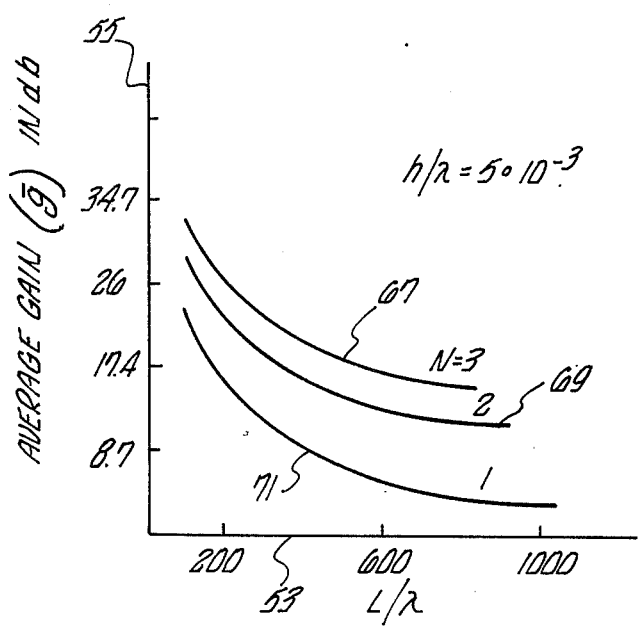
FIG. 10 is a graph illustrating another example of gain versus grating necessary to provide oscillation.

FIGS. 9 and 10 are plots of the average gain $\bar{g}$ required for oscillation as a function of $L/\lambda$, the length of the grating or perturbation devided by the wavelength of the acoustic wave, for two values of $h/\Lambda$, the height of the perturbations divided by the length of one grating cell. The different curves illustrate the different longitudinal modes N. The mode of N = 1 is nearest to the Bragg frequency. The normalized coupling coefficient is assumed to be $$\frac{ihL}{\lambda^2}.$$

The FIG. 9 graph illustrates three different longitudinal modes N, curve 61 for N = 1, curve 59 for N = 2, and curve 57 for N = 3, for the condition where $h/\lambda = 2 \cdot 10^{-3}$. FIG. 10 is a set of curves for the three different longitudinal modes of N, curve 71 for N = 1, curve 69 for N = 2, and curve 67 for N = 3, for the condition where $h/\lambda = 5 \cdot 10^{-3}$.

Consider now a specific example where
$\lambda = 3\mu$
$\Lambda = 1.5\mu$
L = 2mm For $h/\Lambda = 4 \cdot 10^{-3}$, the average gain coefficient ($\bar{g}$) needed for the first mode is $g = 15 \text{cm}^{-1}$. For $h/\lambda = 1 \cdot 10^{-2}$, $\bar{g} = 6 \text{ cm}^{-1}$. These two values correspond to an average relative imaginery wave vector ($\beta_i/\beta_r$) equal to $0.75 \cdot 10^{-3}$ and $0.3 \cdot 10^{-3}$, respectively. The forward gain should be well above these values at least by a factor of two to account for losses due to bulk radiations which usually are small and for the fact that the backward wave is attenuated.

It is well known that relative imaginery wave vectors well above $1.5 \cdot 10^{-3}$ can be achieved. To minimize the attenuation of the backward travelling acoustic wave, the electron drift velocity $v_0$ should not exceed the acoustic wave velocity $v_a$. If such were not the case, the backward resonant attenuation of the acoustic wave would occur at about the same frequency as the forward resonant amplification.

Taking ($v_0/v_a$), an electron drift velocity over an acoustic wave velocity ratio equal to 5, the imaginery wave vector ($\beta_i/\beta_r$) is larger than $1.5 \cdot 10^{-3}$ over a very wide frequency band from about $10^{-3}\omega_\sigma$ to $0.1\omega_\sigma$, depending on the magnetic field and the diffusion coefficient. $\omega_\sigma$ is the effective carrier relaxation frequency.

In summary what has been illustrated and described is a narrow bandwidth acoustic surface wave oscillator that is virtually self sustaining by means of positive feedback and which can be conveniently used with distributed feedback laser devices.

What is claimed is:

1. Apparatus for generating oscillating acoustic surface waves having a wavelength $\lambda$, comprising:
   a piezoelectric medium;
   a semiconductor medium adjacent said piezoelectric medium;
   a grating of individual, unconnected bars at the interface between said piezoelectric and said semiconductor medium, said grating bars being regularly spaced along said interface on centers at an interval of $\lambda/2$ in the plane of the interface; and
   means attached to said piezoelectric medium for creating an electron drift therein parallel to the plane of the interface between said piezoelectric and said semiconductor medium and along the length of the interface, thereby establishing an oscillating acoustic surface wave travelling in the direction of the electron drift.

2. The apparatus of claim 1 wherein said grating comprises a surface corrugation wherein said grating bars are formed out of said piezoelectric medium by grooving said piezoelectric medium in the plane of the interface between said piezoelectric and said semiconductor medium perpendicular to the electron drift in said semiconductor medium.

3. The apparatus of claim 1 wherein said grating comprises a surface corrugation wherein said grating bars are formed out of said semiconductor medium by grooving said semiconductor medium in the plane of the interface between said piezoelectric and said semiconductor medium perpendicular to the electron drift in said semiconductor medium.

4. The apparatus of claim 1 wherein said grating comprises a periodic disposition wherein said grating bars are strips of material deposited in the plane of the interface between said piezoelectric and said semiconductor medium perpendicular to the electron drift in said semiconductor medium.

5. The apparatus of claim 2 wherein said grating has a height $h$ that is much smaller than the wavelength $\lambda$.

* * * * *